(12) United States Patent
Ham

(10) Patent No.: US 10,317,013 B2
(45) Date of Patent: Jun. 11, 2019

(54) DYNAMIC BOIL-OFF REDUCTION WITH IMPROVED CRYOGENIC VESSEL

(71) Applicant: KONINKLIJKE PHILIPS N.V., Eindhoven (NL)

(72) Inventor: Cornelis Leonardus Gerardus Ham, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 304 days.

(21) Appl. No.: 15/037,062

(22) PCT Filed: Oct. 17, 2014

(86) PCT No.: PCT/EP2014/072318
§ 371 (c)(1),
(2) Date: May 17, 2016

(87) PCT Pub. No.: WO2015/074809
PCT Pub. Date: May 28, 2015

(65) Prior Publication Data
US 2016/0281933 A1    Sep. 29, 2016

(30) Foreign Application Priority Data
Nov. 22, 2013 (EP) .................. 13193964

(51) Int. Cl.
*F17C 13/00* (2006.01)
*G01R 33/38* (2006.01)
(Continued)

(52) U.S. Cl.
CPC .......... *F17C 13/001* (2013.01); *F17C 3/085* (2013.01); *F17C 13/007* (2013.01);
(Continued)

(58) Field of Classification Search
CPC ...... F17C 13/001; F17C 3/085; F17C 13/007; G01R 33/3815; G01R 33/3802; G01R 33/3804; H01F 6/04
(Continued)

(56) References Cited

U.S. PATENT DOCUMENTS 3,211,218 A * 10/1965 Mehr .................. F24F 1/01
165/123
4,694,663 A   9/1987 Miller
(Continued)

FOREIGN PATENT DOCUMENTS

| GB | 942370 A | 11/1963 |
| JP | 0582333 A | 4/1993 |
| JP | 2013098449 A | 5/2013 |

*Primary Examiner* — Melissa J Koval
*Assistant Examiner* — Courtney G McDonnough

(57) ABSTRACT

The present invention provides a cryogenic vessel (200), in particular for use in a magnetic resonance examination system (110) to mount therein superconductive main coils (142, 144) of the magnetic resonance examination system (110), comprising an inner vessel (202), an outer 300K vessel (204), and a radiation shield (206), which is located between the inner vessel (202) and the outer 300K vessel (204) and which surrounds the inner vessel (202), whereby the radiation shield (206) has at least one dry-friction area (206), where dry-friction is generated upon deformation of the radiation shield (206). The present invention also provides a superconductive magnet (114) for a magnet resonance examination system (110) comprising a set of superconductive main coils (142, 144), which are arranged in the above cryogenic vessel (200). The present invention further provides a magnet resonance examination system (110) comprising the above superconductive magnet (122).

19 Claims, 9 Drawing Sheets

(51) Int. Cl.
*G01R 33/3815* (2006.01)
*H01F 6/04* (2006.01)
*F17C 3/08* (2006.01)

(52) U.S. Cl.
CPC ..... *G01R 33/3802* (2013.01); *G01R 33/3804* (2013.01); *G01R 33/3815* (2013.01); *H01F 6/04* (2013.01)

(58) Field of Classification Search
USPC ........................................................ 324/318
See application file for complete search history.

(56) References Cited

U.S. PATENT DOCUMENTS

| | | | |
|---|---|---|---|
| 6,038,867 A * | 3/2000 | Einziger | G01R 33/3815 505/892 |
| 7,170,377 B2 | 1/2007 | Jiang | |
| 7,646,272 B1 | 1/2010 | Schmierer et al. | |
| 8,269,587 B2 | 9/2012 | Inoue | |
| 8,319,588 B2 | 11/2012 | Calvert | |
| 9,279,871 B2 | 3/2016 | Shen et al. | |
| 2004/0017117 A1* | 1/2004 | Kwon | F25B 9/145 310/61 |
| 2005/0190030 A1* | 9/2005 | Watanabe | G01R 33/3815 335/296 |
| 2006/0022779 A1* | 2/2006 | Jiang | F25D 19/006 335/216 |
| 2006/0266053 A1 | 11/2006 | Jiang | |
| 2007/0001792 A1 | 1/2007 | Nemoto | |
| 2012/0313642 A1 | 12/2012 | Zia | |

* cited by examiner (State of the art)

(State of the art)

(State of the art)

(State of the art)

DYNAMIC BOIL-OFF REDUCTION WITH IMPROVED CRYOGENIC VESSEL

CROSS REFERENCE TO RELATED APPLICATIONS

This application is a U.S. national phase application of International Application No. PCT/EP2014/072318, filed on Oct. 17, 2014, which claims the benefit of EP Application Serial No. 13193964.7 filed on Nov. 22, 2013 and is incorporated herein by reference.

FIELD OF THE INVENTION

The invention relates to the field of magnetic resonance (MR) examination systems, in particular to the field of superconductive magnets for MR examination systems, still more particular to the field of cryogenic vessels for superconductive magnets for MR examination systems.

BACKGROUND OF THE INVENTION

A magnetic resonance (MR) examination system comprises a superconductive magnet with a cryogenic vessel, in which main magnet coils of the superconductive magnet are mounted. The cryogenic vessel typically comprises two vessels, which are mounted spaced apart to achieve thermal isolation, and a mounting structure, which is located within the two vessels, for mounting main magnet coils of the superconductive magnet. There are two ways to keep the main coils at superconducting temperature. In the first way the superconducting coils are in contact with liquid cryogen. In the second way the superconducting coils are directly cooled from a coldhead, e.g. via copper strands. In the first case, the mounting structure is typically provided as a third, inner vessel, which contains the cryogen, and the main coils are mounted inside the inner vessel. The cryogen is typically provided as liquid having a low boiling temperature, e.g. a boiling temperature of about 4.2 K in case of helium, which already evaporates when small amounts of heat enter.

FIG. 1 shows a state of the art superconductive magnet. The superconductive magnet 10 comprises a cryogenic vessel 12 and a set of main magnet coils 14, 16. The cryogenic vessel 12 comprises three vessels 22, 24, 26, which are mounted spaced apart to achieve thermal isolation. The three vessels 22, 24, 26 are an inner vessel 22, also referred to as 4K vessel when helium is used, a radiation shield 24, which is provided as a vessel surrounding the inner vessel 22, and an outer vessel 26, also referred to as 300K vessel, surrounding the radiation shield 24. The outer vessel 26 is usually made of stainless steel or aluminum and the radiation shield 24 of aluminum. The main magnet coils 14, 16 are mounted at an inner side of the inner vessel 22 along inner and outer cylindrical walls 28, 30 as inner and outer coils 14, 16, respectively. The inner vessel 22 contains a cryogen, e.g. liquid helium, which cools the main magnets 14, 16 and also enables heat buffering. Such a superconductive magnet is e.g. known from U.S. Pat. No. 7,170,377 B2.

Gradient switching induces dissipation in this superconductive magnet. This leads to boil-off of the cryogen in the cryogenic vessel. Former superconductive magnets simply blow the cryogen into the air when boil-off occurred. As a consequence cryogen had to be refilled frequently. State-of-the-art superconductive magnets have zero boil-off. Therefore, the dissipation in the magnet leads to an increase of pressure in the inner vessel. This phenomenon is called dynamic boil-off (DBO).

In detail, dynamic boil-off is caused by lack of eddy current shielding of the radiation shield due to mechanical resonances. When a gradient coil is switched, its stray field changes. As a consequence, eddy currents are induced in the radiation shield. Due to the eddy currents, forces are applied to this shield and the shield might start moving, e.g. oscillating. Its behavior depends on mass, stiffness and geometry of the radiation shield. Accordingly, the dynamic boil-off is a function of the frequency of the gradient switching. The DBO transfer function shows peaks as indicated in FIG. 2, which are related to mechanical resonances. This refers to mechanical resonances of the superconductive magnet, in particular of the radiation shield.

When the radiation shield would not move, which would imply infinite stiffness and infinite mechanical impedance, the attenuation of the stray field of the gradient coil would be monotonously increasing, i.e. only determined by the time constant of the shield. In that case, FIG. 2 would not show any peaks.

The peaks in the DBO graph of FIG. 2 are caused by mechanical resonances, as already discussed above. The mechanical impedance at a resonance is low. The lower the damping, the higher the Q factor and the lower the mechanical impedance. Since internal material damping decreases with lower temperatures, the magnitude of the damping can be several orders lower for very low temperatures close to 0K, as indicated in FIG. 3. Hence, also the impedance of the radiation shield is low, so that it moves easily with the applied magnetic field and can enter in resonance.

FIG. 4 shows another state of the art superconductive magnet. The superconductive magnet 10 comprises in accordance with the typical cryogenic vessel 12 of FIG. 1 and a set of main magnet coils 14, 16. The cryogenic vessel 12 comprises two vessels 24, 26, which are mounted spaced apart to achieve thermal isolation. The two vessels 24, 26, refer to the radiation shield 24 and the outer vessel 26 as described above. The cryogenic vessel 12 further comprises a mounting structure 32, which is located inside the radiation shield 24. The main magnet coils 14, 16 are mounted to the mounting structure 32. Cold heads 15 are in contact with the main magnet coils 14, 16 to keep them at superconducting temperature. Accordingly, this superconductive magnet does not require the use of a cryogen.

The superconductive magnet without cryogen does not suffer from boil-off. Nevertheless, also for this type of superconducting magnet it is important to reduce heat from gradient switching, i.e. from movements of the radiation shield due to due to mechanical resonances, since there is no buffering/cooling from the cryogen for locally generated heat.

One approach is to reduce resonances in relevant frequency ranges based on geometry of the superconductive magnet and the cryogenic vessel. For example, thickness of the radiation shield can be increased to shift resonance frequencies into frequencies ranges, which are not relevant for the above problems like boil-off. As a consequence, superconductive magnet coils have a larger radius as well. This requires more superconductor material for the same magnetic field in an imaging volume of the MR examination system. A too thick radiation shield has the additional disadvantage that it might be destroyed due to the eddy current forces from a quench. A thinner radiation shield is also not an option. A too thin radiation shield does not conduct the heat sufficiently towards the cold head of the cryogenic system.

Another approach is based on material properties, e.g. on the choice of material. The resonance frequency is determined by $E/\rho$, where E is the Young's modulus E and $\rho$ refers to the specific mass. The radiation shield is usually made from aluminum. $E/\rho$ is relatively high for aluminum compared to other materials suitable for the use in cryogenic vessels for superconductive magnets. Hence, a change of material cannot reasonably reduce the above problems.

Another potential option that has proven not applicable is to add a visco-elastic layer to reduce the magnitude of the resonances of the cryogenic vessel. This is, however not feasible. First of all, the damping property of visco-elastic material is negligible at low temperature. Second, visco-elastic materials tend to generate gasses, which cause serious problems in a high-vacuum environment such as a superconducting magnet.

Apart from the cryogen problems described above in respect to the boil-off, there is also a risk of a magnet quench. As a consequence additional measures have been taken in the superconductive magnet, which are expensive and can add costs of several thousands of Euros to a single superconductive magnet.

The U.S. Pat. No. 6,038,867 shows a superconducting magnet with insulating blankets. The known superconducting magnet comprises a helium pressure vessel which contains a superconducting magnet coil assembly. The Helium pressure vessel is surrounded by a thermally insulating shield (between the He-vessel and a vacuum vessel. Additionally, thermal insulation blankets are disposed between the radiation shield and the vacuum vessel. Each thermal insulation blanket is formed as a plurality of thermally reflective (Al) sheets separated by low conductively metal spacer sheets.

SUMMARY OF THE INVENTION

It is an object of the invention to provide a cryogenic vessel, a superconductive magnet for a magnetic resonance (MR) examination system comprising such a cryogenic vessel and a MR examination systems comprising such a superconductive magnet, which overcome the above problems. In particular, it is an object of the present invention to provide a cryogenic vessel which has reduced mechanical vibrations and resonances in the radiation shield. It is a further object of the present invention to reduce boil-off of cryogen used in the cryogenic vessel for cooling the main coils of the superconductive magnet.

This object is achieved by a cryogenic vessel, in particular for use in a magnetic resonance examination system, to mount therein superconductive main coils of the magnetic resonance examination system, comprising an outer 300K vessel, and a radiation shield, which is located inside the outer 300K vessel, and an inner mounting structure for mounting the superconductive main coils, which is located within the radiation shield, whereby the radiation shield has at least one dry-friction area, where dry-friction is generated upon deformation of the radiation shield.

This object is also achieved by a superconductive magnet for a magnet resonance examination system comprising a set of superconductive main coils, which are arranged in a cryogenic vessel as specified above.

This object is also achieved by a magnet resonance examination system comprising a superconductive magnet as specified above.

The at least one dry-friction area enables to increase the mechanical damping of vibrations due to gradient switching. The dry-friction achieves mechanical damping of the cryogenic vessel, in particular of the radiation shield. The mechanical impedance is improved and therefore the radiation shield of the cryogenic vessel is less susceptible for mechanical vibrations and resonances. The at least one dry-friction area can be used independently from other measures to reduce vibrations due to mechanical resonances of the radiation shield. Accordingly, the at least one dry-friction area can be added to the radiation shield to improve state of the art cryogenic vessels, or to replace other expensive means for reduction of mechanical resonances. Since the damping is improved with the design of the radiation shield itself, drawbacks of the use of damping materials are avoided such as low elasticity and release of gases at low temperatures. Heat, which is generated due to the dry-friction at the dry-friction area, can be easily cooled away by a cryo-cooling system, since a typical cold head has a performance of approximately 100 W at an operation temperature of 40K, which is the typical temperature of the radiation shield during operation. Accordingly, heat dissipation can be easily achieved.

Preferably, the vibrations are reduced at resonance peaks of the radiation shield. Hence, dynamic boil off of cryogen due to gradient switching can be reduced. The at least one dry-friction area is preferably provided locally, for instance in an area where local vibrations occur and e.g. DBO has the highest impact, such as at the location of the main coils of the superconductive magnet.

According to a preferred embodiment the at least one dry-friction area comprises at least two shield layers, which are stacked on each other in surface contact, whereby the at least two shield layers are locally connected to each other. The surface contact enables the dry friction in-between the local connections. Preferably, the at least two shield layers are pressed to each other to increase the dry friction.

According to a preferred embodiment the at least two shield layers are locally connected to each other by spot welding. Accordingly, the at least two shield layers are mechanically attached to each other at welding spots, and a contact area between the at least two shield layers is provided with a surface contact. Therefore, the at least two shield layers can move relative to each other at their surface contact, when the radiation shield is deformed, e.g. due to vibrations. While moving relative to each other, the at least two shield layers experience dry friction and the mechanical resonances are damped. Preferably, spot welding is used to attach a local patch as second shield layer to the first shield layer.

According to a preferred embodiment the at least two shield layers are locally connected to each other by rolling. Preferably, the outer layer is stretched and the inner layer is compressed due to the rolling. As a consequence the outer layer can automatically be pressed against the inner layer. Preferably, the two shield layers are locally connected by a combination of rolling and spot welding. Rolling can be used e.g. to provide an entire cylindrical wall of the radiation shield with two shield layers. Preferably, the inner and outer cylindrical walls are both provided entirely with two shield layers.

According to a preferred embodiment at least one shield layer of the radiation shield is made of aluminum. Aluminum is a suitable material for the shield layer, since it has a high static damping coefficient, which enables an efficient damping of vibrations. In case both shield layers are made of aluminum, static damping coefficient of approximately $\mu s=1.35$ can be achieved.

According to a preferred embodiment at least two shield layers of the radiation shield are made of different materials. The two layers can be provided so that they are in surface contact for a typical operation temperature of the radiation shield, which is approximately 40K. The thermal shrink can be used to provide the two shield layers being pressed together at the operation temperature. Preferably, one shield layer is made of copper and the other shield layer is made of aluminum. Another preferred material combination is aluminum and stainless steel, which can achieve a damping coefficient of approximately $\mu s=0.61$.

According to a preferred embodiment at least two shield layers of the radiation shield have a different thickness. By choosing the thickness of the at least two shield layers individually, a suitable thickness combination can be chosen to provide an efficient damping. Preferably, the two shield layers of the radiation shield having a different thickness are made of different materials. By a choosing a suitable combination of materials and thickness, the two shield layers can be provided to enable an efficient damping of vibrations. Additionally, a choice of materials can be used which enables efficient provisioning of the radiation shield.

According to a preferred embodiment the radiation shield has a uniform thickness in at least one cylindrical wall of the cryogenic vessel. This enables the provision of a radiation shield, which can be used without structural modification of the cryogenic vessel. Preferably, the total thickness of the radiation shield remains the same compared to state of the art cryogenic vessels. Hence, the radiation shield can easily be used to improve state of the art cryogenic vessels.

According to a preferred embodiment the at least one dry-friction area comprises a local patch, which is attached to the radiation shield. This is preferably used in an area, where space is less constrained. Hence, the patch could be applied on a flange of the radiation shield. The dimensions of the radiation shield in a radial direction remain unaffected. The patch can be easily applied, e.g. by rolling and/or spot welding, so that the radiation shield with reduced vibrations be provided with only small additional effort. Hence, in case of cryogenic vessels for use of a cryogen, dynamic boil-off can be reduced.

According to a preferred embodiment at least one dry-friction area is provided at one of the longitudinal ends of a cylindrical wall of the cryogenic vessel. At least one coil of the main magnet is typically located at one of the longitudinal ends, so that vibrations with high magnitude are generated in this area. With the dry-friction area provided at one of the longitudinal ends of a cylindrical wall, these vibrations can be efficiently reduced. Hence, in case of cryogenic vessels for use of a cryogen, dynamic boil-off can be reduced.

According to a preferred embodiment at least one dry-friction area is provided at one flange of the cryogenic vessel. The flange of the cryogenic vessel provides enough space, so that the dry-friction area can easily be formed therein without violating space constraints. The superconductive magnet as well as the cryogenic vessel usually do not underlie constructive restrictions in their longitudinal direction, so that the two shield layers can easily be provided at the flanges of the cryogenic vessel. Furthermore, at least one coil of the main magnet is typically located close to a flange, so that vibrations with high magnitude are generated in this area. With the dry-friction area located in the flange, these vibrations can be efficiently reduced.

According to a preferred embodiment the inner mounting structure is provided as an inner vessel for mounting the superconductive main coils therein, whereby the inner vessel is adapted for containing a cryogen. The main magnet coils are mounted within the inner vessel, so that they can be efficiently cooled by the cryogen. The cryogen, e.g. liquid helium, enables heat buffering, which facilitates the cooling of the main magnet coils. The main magnet coils can be mounted directly to inner and outer cylindrical walls of the inner vessel.

According to a further preferred embodiment the inner mounting structure comprises a mounting frame, for mounting the inner and/or outer set of outer coils within the inner vessel. The mounting frame can be mounted to the inner cylindrical wall of the inner vessel or to the outer cylindrical wall of the inner vessel. When mounted to the inner cylindrical wall of the inner vessel, the mounting frame may extend towards the outer cylindrical wall, where the set of outer coils can be mounted at least partially to the mounting frame. When mounted to the outer cylindrical wall of the inner vessel, the mounting frame may extend towards the inner cylindrical wall, where the set of inner coils can be mounted at least partially to the mounting frame. Furthermore, the mounting frame can be mounted to both the inner and outer cylindrical walls and extend between the inner and outer cylindrical walls. With the mounting frame, the set of inner and/or the outer coils can be mounted to the mounting frame at the respective position at the inner and/or outer cylindrical wall, without being mounted thereto. Accordingly, the set of inner and/or the outer coils can be mounted entirely or at least partially to the mounting frame, so that a space for circulation of the cryogen can be provided between the set of inner and/or the outer coils and the inner and/or outer cylindrical wall, respectively.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
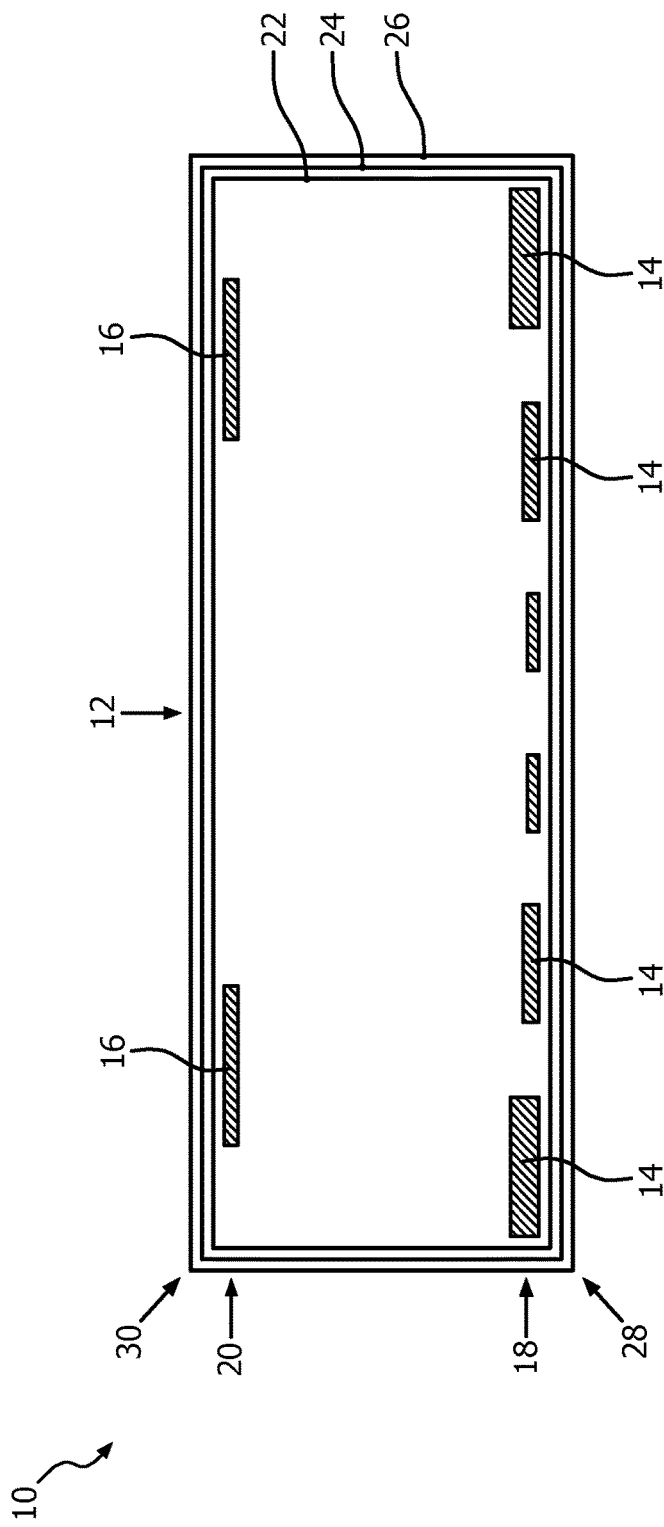
FIG. 1 shows a superconductive magnet of a magnetic resonance examination system known in the art.
Figure 2:
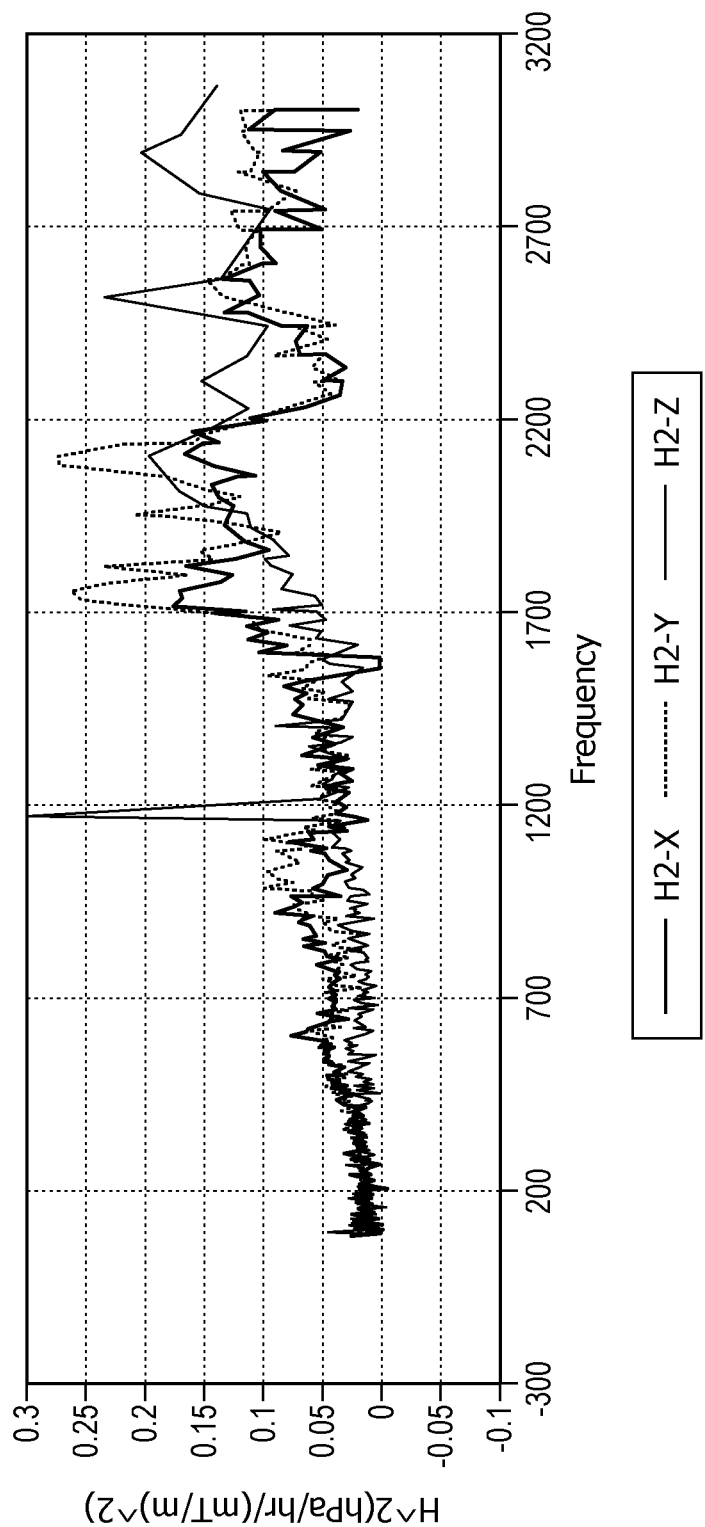
FIG. 2 shows a dynamic boil-off transfer function over the frequency having peaks, which are related to mechanical resonances.
Figure 3:
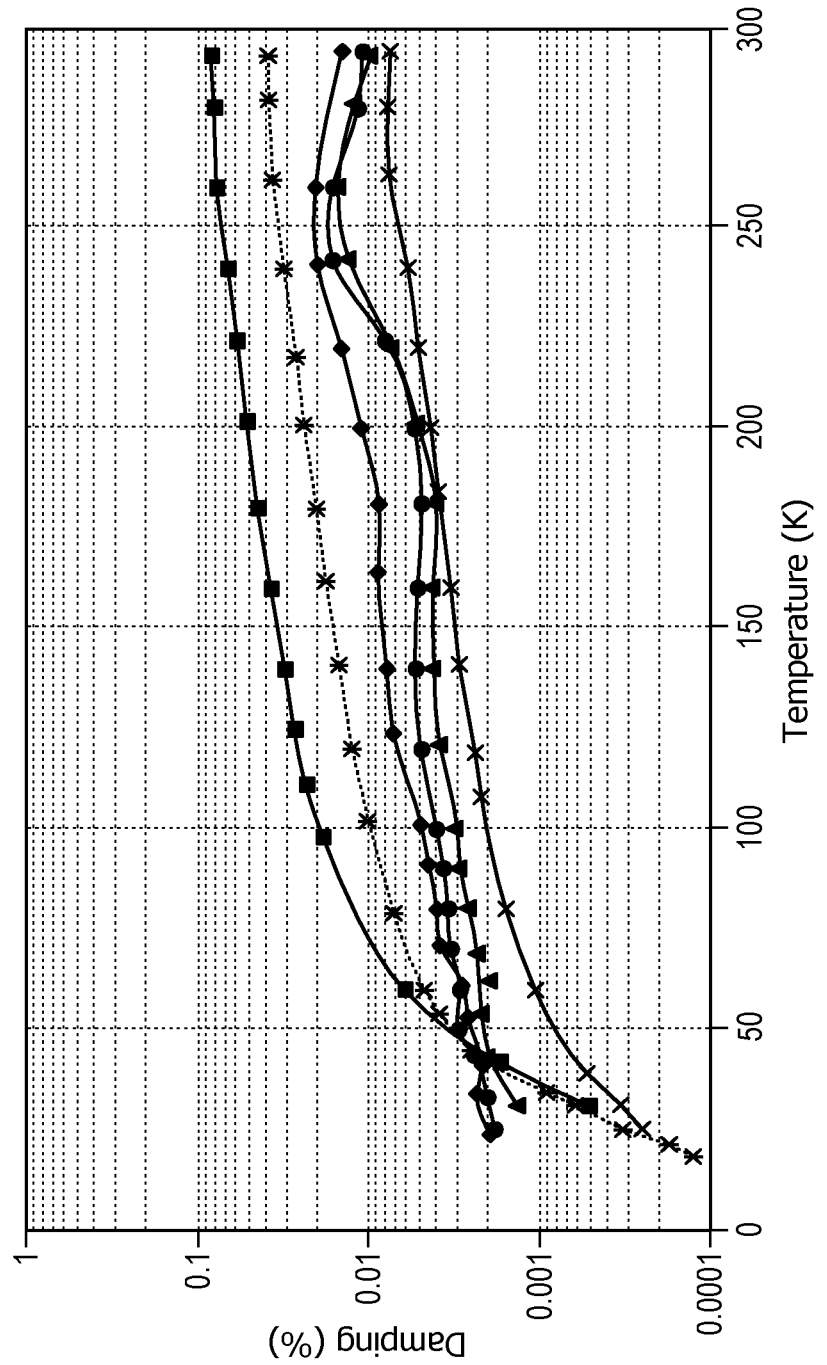
FIG. 3 shows a decrease of internal material damping for low temperatures.
Figure 4:
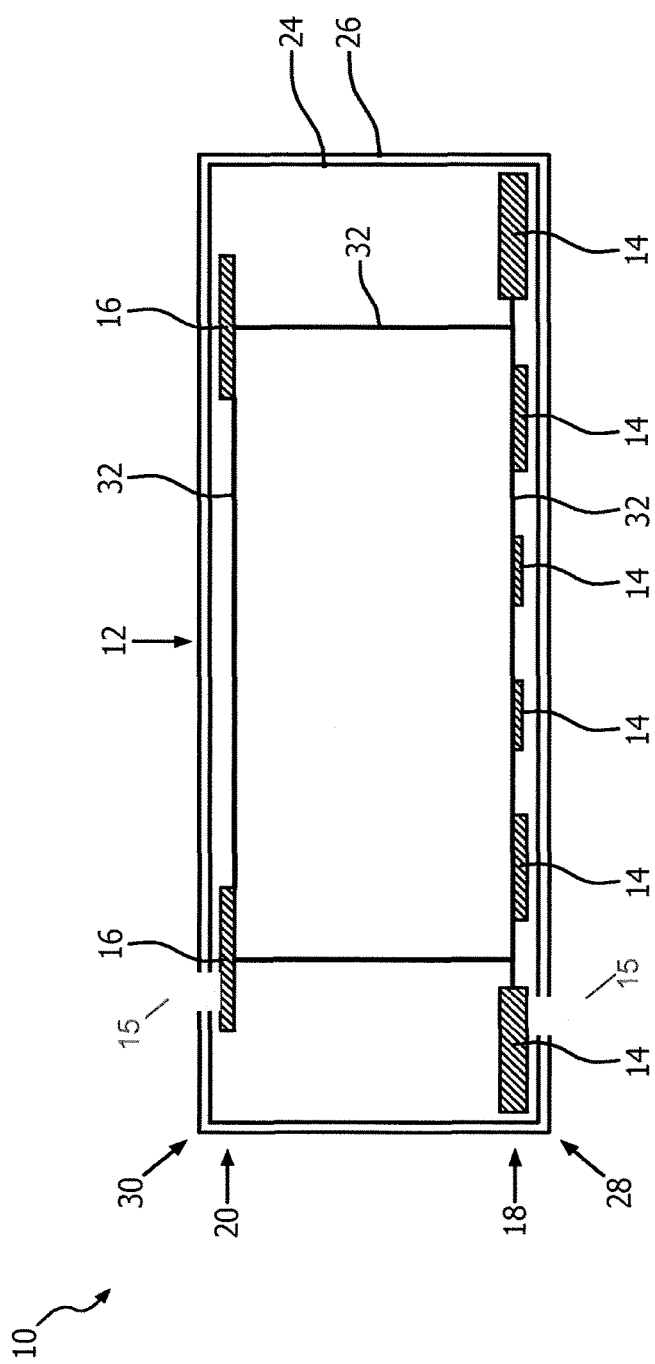
FIG. 4 shows a different superconductive magnet of a magnetic resonance examination system known in the art.
Figure 5:
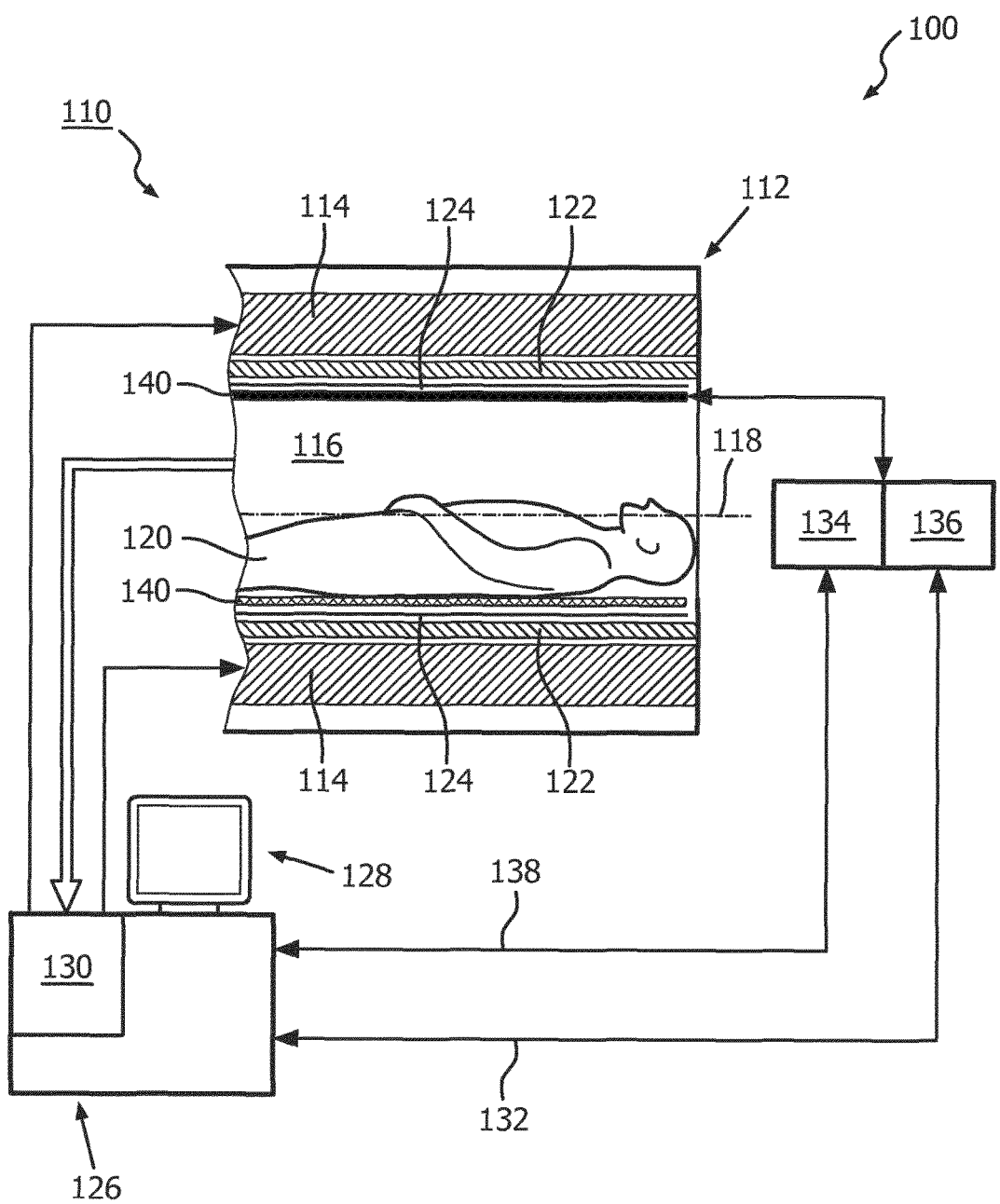
FIG. 5 shows a general setup of a magnetic resonance examination system in accordance with a preferred embodiment of the invention.

FIG. 5 shows a schematic illustration of a part of an embodiment of a magnetic resonance (MR) examination system 110 comprising an MR scanner 112. The MR examination system 110 includes a main magnet 114 provided for generating a static magnetic field. The main magnet 114 has a central bore that provides an examination space 116 around a center axis 118 for a subject of interest 120, usually a patient, to be positioned within. In an alternative embodiment a different type of MR imaging system providing an examination region within a main magnetic field is used. Further, the MR examination system 110 comprises a magnetic gradient coil system 122, provided for generating gradient magnetic fields superimposed to the static magnetic field. The main magnet 122 is concentrically arranged within the bore of the main magnet 114, as known in the art.

Further, the MR examination system 110 includes a radio frequency (RF) antenna device 140 designed as a whole-body coil having a tubular body. The RF antenna device 140 is provided for applying an RF magnetic field to the examination space 116 during RF transmit phases to excite nuclei of the subject of interest 120. The RF antenna device 140 is also provided to receive MR signal from the excited nuclei during RF receive phases. In a state of operation of the MR examination system 110, RF transmit phases and RF receive phases are taking place in a consecutive manner. The RF antenna device 140 is arranged concentrically within the bore of the main magnet 114. As is known in the art, a cylindrical metal RF screen 124 is arranged concentrically between the main magnet 122 and the RF antenna device 140.

Moreover, the MR examination system 110 comprises an MR image reconstruction unit 130 provided for reconstructing MR images from the acquired MR signals and an MR imaging system control unit 126 with a monitor unit 128 provided to control functions of the MR scanner 112, as is commonly known in the art. Control lines 132 are installed between the MR imaging system control unit 126 and an RF transmitter unit 134 that is provided to feed RF power of an MR radio frequency to the RF antenna device 140 via an RF switching unit 136 during the RF transmit phases. The RF switching unit 136 in turn is also controlled by the MR imaging system control unit 126, and another control line 138 is installed between the MR imaging system control unit 126 and the RF switching unit 136 to serve that purpose. During RF receive phase, the RF switching unit 136 directs the MR signals from the RF antenna device 140 to the MR image reconstruction unit 130 after pre-amplification.

Figure 6:
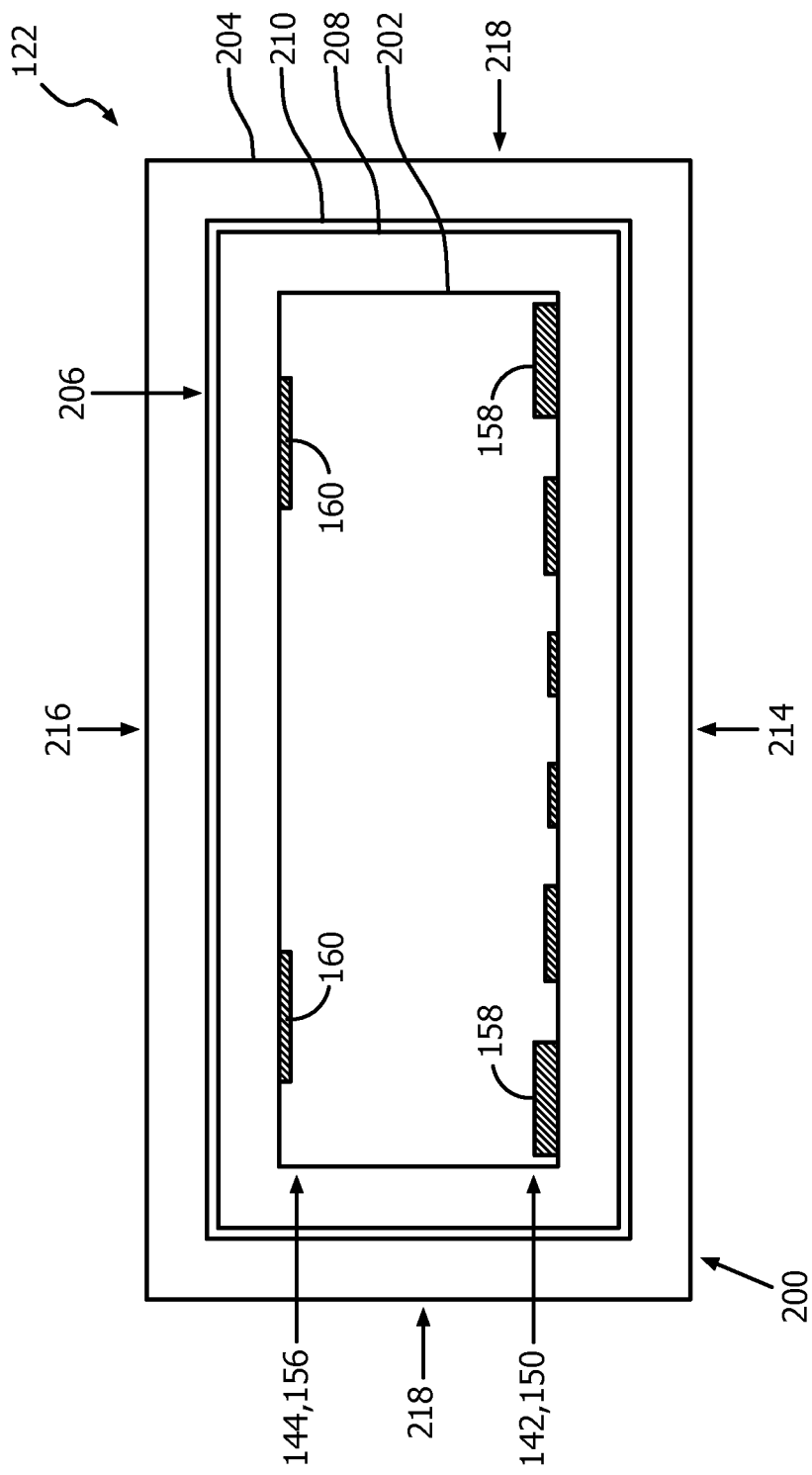
FIG. 6 shows in detail a first embodiment of the main magnet of FIG. 5 including its cryogenic vessel as a partial sectional view including its rotational axis of symmetry.
Figure 8:
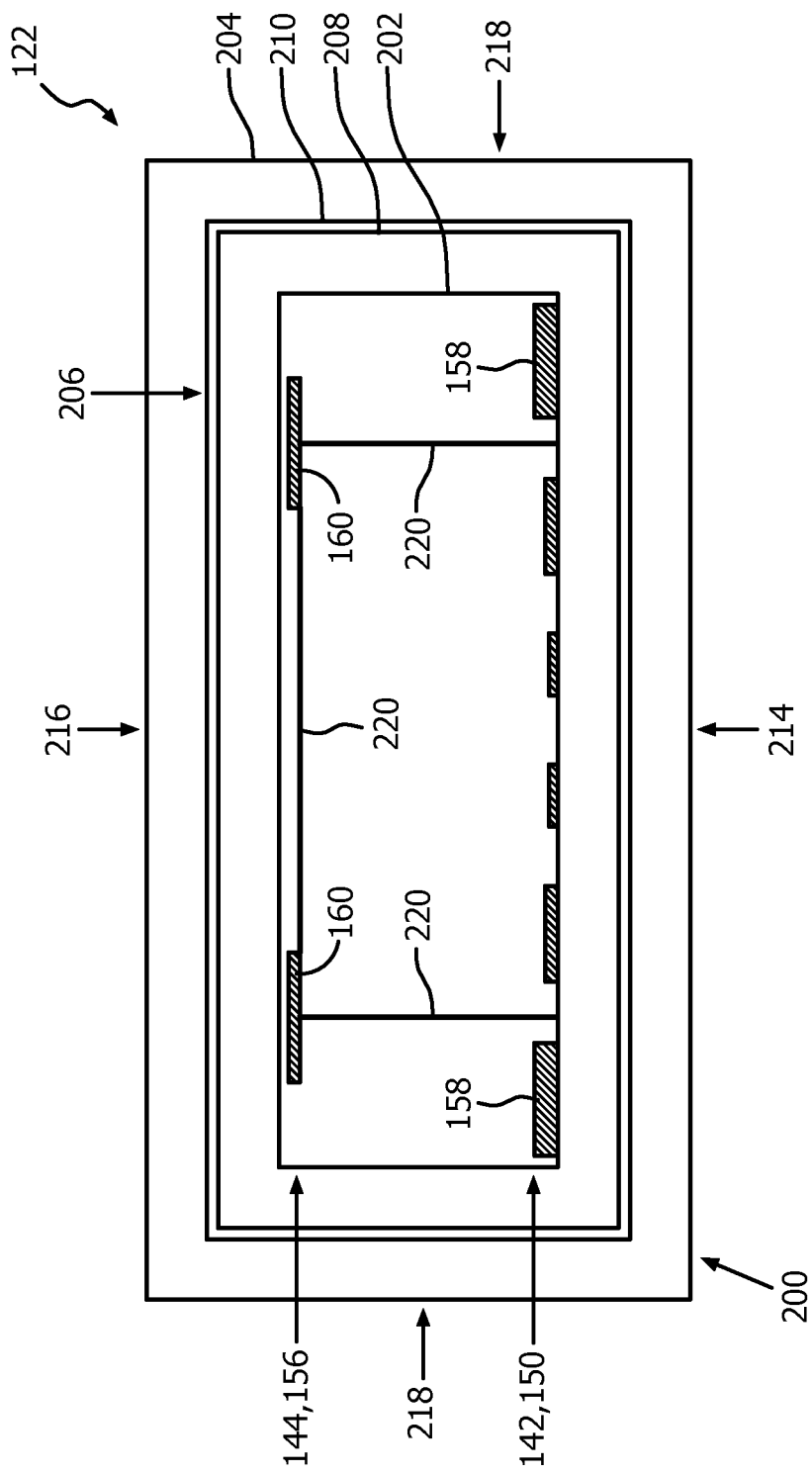
FIG. 8 shows in detail a second embodiment of the main magnet of FIG. 5 including its cryogenic vessel as a partial sectional view including its rotational axis of symmetry.

As can be seen in FIGS. 6 and 8 in detail, the main magnet 114 comprises two sets of coils 142, 144, a set of inner coils 142 and a set of outer coils 144. The set of inner coils 142 comprises inner conductive loops 158, which are cylindrically arranged in an inner part of the main magnet 114 and spaced apart along the z-axis of the main magnet 114, and the set of outer coils 144 comprises a set of outer conductive loops 160, which are arranged in parallel to each other and spaced apart along the z-axis of the main magnet 114.

Figure 7:
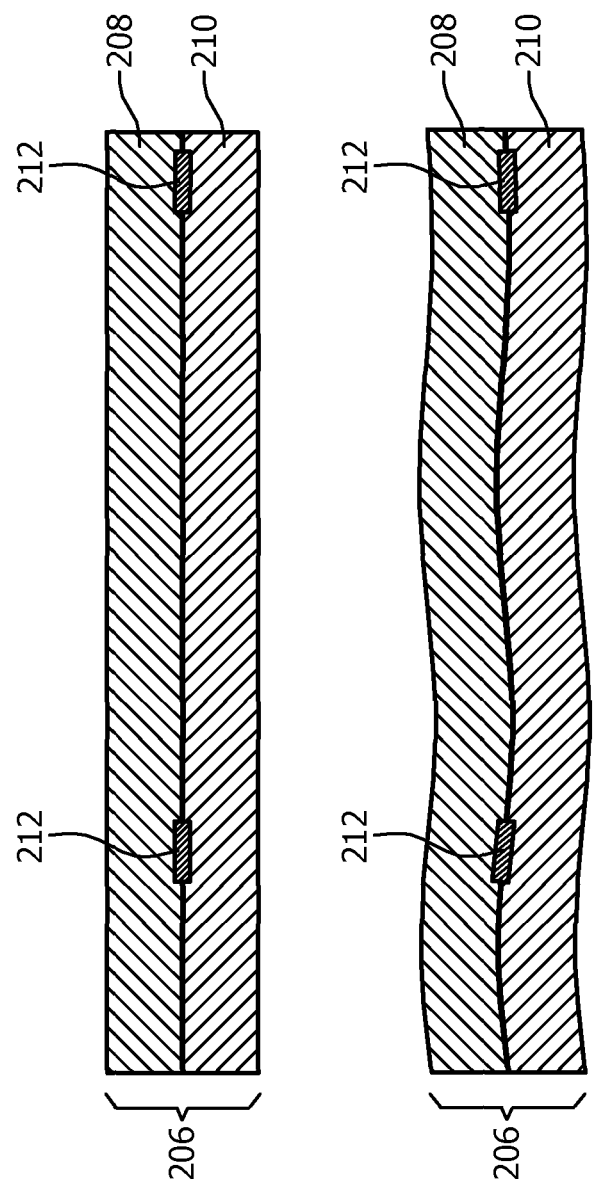
FIG. 7 shows in detail a sectional view of two layers of the radiation shield of the superconductive magnet of FIG. 6 with and without vibration.

FIGS. 6 and 7 refer to the main magnet 114 shown in FIG. 5 according to a first embodiment. The main magnet 114 is a superconductive magnet and comprises a cryogenic vessel 200, as can be seen in FIG. 6. The cryogenic vessel 200 comprises an inner vessel 202, also referred to as 4K vessel, an outer 300K vessel 204 and a radiation shield 206, which is located between the inner vessel 202 and the outer 300K vessel 204 and which surrounds the inner vessel 202. The inner vessel 202, the radiation shield 206, and the outer 300K vessel 204 are spaced apart for thermal isolation purposes. In this embodiment, the inner vessel 202 is provided to contain liquid helium, which is used as cryogen.

The inner vessel 202 in the first embodiment is used as inner mounting structure for mounting the inner and outer coils 142, 144 therein. The set of inner coils 142 is mounted at an inner cylindrical wall 214 within the inner vessel 202, and the set of outer coils 144 is mounted at an outer cylindrical wall 216 within the inner vessel 202.

The radiation shield 206 comprises an inner and an outer shield layer 208, 210, which are stacked on each other in surface contact. The inner and outer shield layers 208, 210, are connected by rolling, whereby the outer layer 210 is stretched and the inner layer 208 is compressed. The entire radiation shield 206 including the inner and outer cylindrical walls 214, 216 and the flanges 218 of the cryogenic vessel 200 comprises the two shield layers 208, 210.

The two shield layers 208, 210 are locally connected to each other by spot welding, whereby the shield layers 208, 210 are mechanically attached to each other at welding spots 212. The welding spots 212 are spaced apart from each other, as can be seen e.g. in FIG. 6, so that the shield layers 208, 210 can move relative to each other between the welding spots 212 to enable dry friction when the radiation shield 206 is deformed, e.g. due to vibrations caused by gradient switching. Hence, the entire radiation shield 206 in this embodiment is provided as dry friction area. The two shield layers 208, 210 are pressed onto each other to increase dry friction.

The two shield layers 208, 210 of the radiation shield 206 are made of aluminum and have the same thickness in this embodiment, providing a radiation shield 206 with a uniform thickness. The total thickness of the radiation shield 206 corresponds to the thickness of typical radiation shields of state of the art cryogenic vessels 200.

In an alternative embodiment, the two shield layers 208, 210 of the radiation shield 206 have a different thickness.

In an alternative embodiment, the second shield layer 210 is locally provided as a patch on the first shield layer 208 in the area of the flanges 218 of the cryogenic vessel 200 and locally connected to each other by spot welding.

FIG. 8 refers to the main magnet 114 shown in FIG. 5 according to a second embodiment. The main magnet 114 of the second embodiment is in major features identical to the main magnet 114 of the first embodiment, so that the details described above in respect to the first embodiment also apply to the main magnet 114 of the second embodiment. Differences between the main magnet 114 of the first and second embodiment are described below. Features not described below in detail are supposed to be identical to respective features of the first embodiment.

The main magnet 114 of the second embodiment is a superconductive magnet and comprises a cryogenic vessel 200, as can be seen in FIG. 8. The cryogenic vessel 200 comprises in accordance with the first embodiment an inner vessel 202, an outer 300K vessel 204 and a radiation shield 206, which is located between the inner vessel 202 and the outer 300K vessel 204. According to the second embodiment, the inner vessel 202 is provided to contain liquid helium, which is used as cryogen.

The inner vessel 202 in the second embodiment is used as inner mounting structure for mounting the inner and outer coils 142, 144 therein. The set of inner coils 142 is mounted at an inner cylindrical wall 214 within the inner vessel 202. The inner vessel 202 comprises a mounting frame 220, and the set of outer coils 144 is mounted at the mounting frame 220 within the inner vessel 202. The mounting frame 220 in this embodiment is mounted to the inner cylindrical wall 214 of the inner vessel 202 and extends towards the outer cylindrical wall 216, where the set of outer coils 144 is mounted to the mounting frame 220 without being in contact with the outer cylindrical wall 216. In a modified embodiment, the mounting frame 220 is mounted to the outer cylindrical wall 216, and the set of inner coils 142 is mounted at the mounting frame 220. According to a further modified embodiment, the sets of inner and outer coils 142, 144 are both mounted on the mounting frame, whereby the mounting frame is either mounted at the inner cylindrical wall 214 of the inner vessel 202, at the outer cylindrical wall 216 of the inner vessel 202, or at the inner and outer cylindrical wall 214, 216.

According to the second embodiment, the radiation shield 206 comprises an inner and an outer shield layer 208, 210, which are stacked on each other in surface contact. The inner and outer shield layers 208, 210, are connected by rolling, whereby the outer layer 210 is stretched and the inner layer 208 is compressed. The entire radiation shield 206 including the inner and outer cylindrical walls 214, 216 and the flanges 218 of the cryogenic vessel 200 comprises the two shield layers 208, 210. The two shield layers 208, 210 are locally connected to each other by spot welding, whereby the shield layers 208, 210 are mechanically attached to each other at welding spots 212, as described above in respect to the first embodiment.

Figure 9:
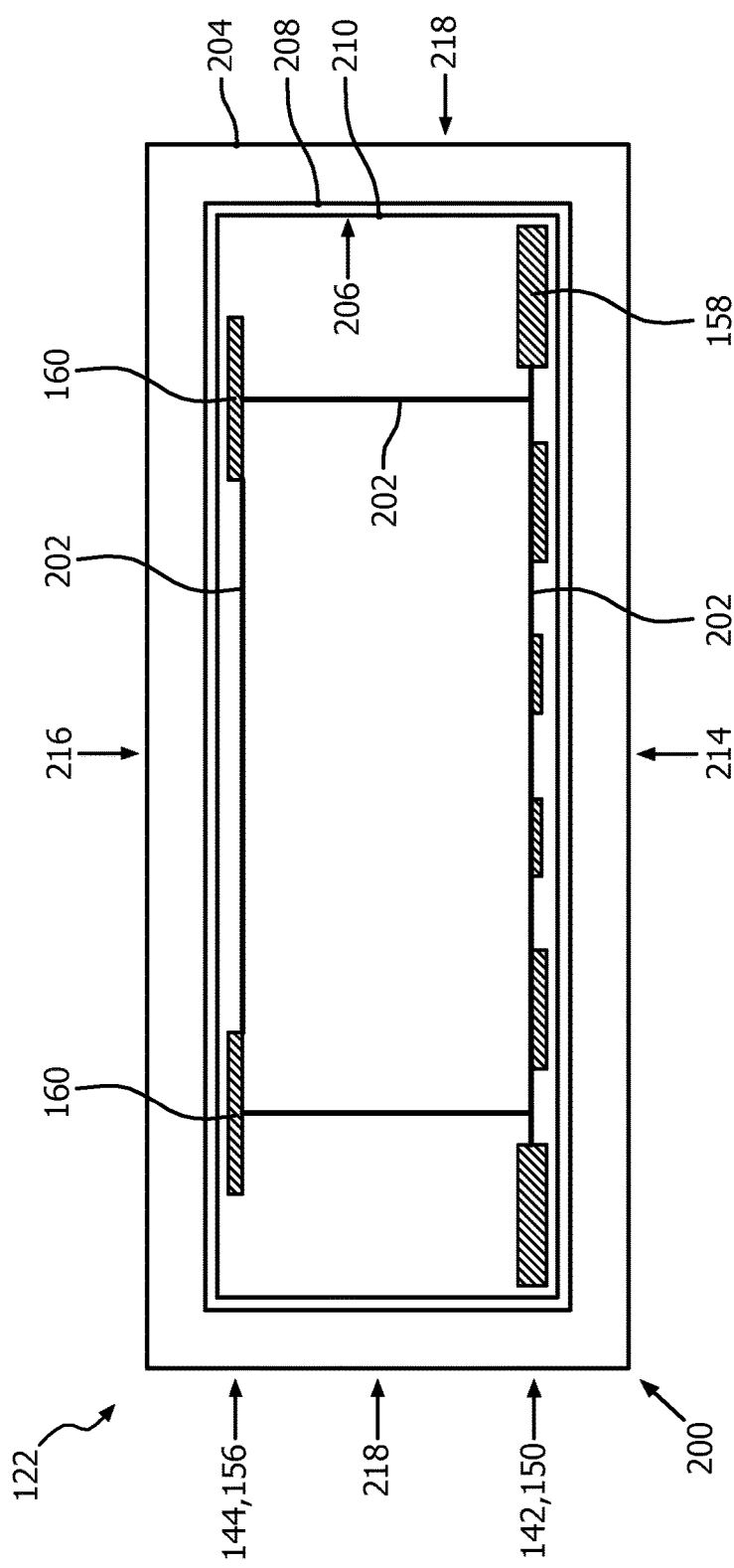
FIG. 9 shows in detail a third embodiment of the main magnet of FIG. 5 including its cryogenic vessel as a partial sectional view including its rotational axis of symmetry.

FIG. 9 shows a main magnet 114 as shown in FIG. 5 according to a second embodiment. Mayor components of the main magnet 114 of the first and second embodiment are identical, so that the same reference numbers are used. Detail of the main magnet 114 not discussed in respect to the second embodiment correspond to those of the main magnet 114 of the first embodiment.

The main magnet 114 according to the second embodiment is a superconductive magnet having a cryogenic vessel 200. The cryogenic vessel 200 comprises an outer 300K vessel 204 and a radiation shield 206, which is located inside the outer 300K vessel 204. The radiation shield 206 and the outer 300K vessel 204 are spaced apart for thermal isolation purposes.

The structure of the radiation shield 206 according to the second embodiment is as described above in respect to the first embodiment.

Within the radiation shield 206 is located an inner mounting structure 202 for mounting the inner and outer coils 142, 144. The set of inner coils 142 is mounted at an inner cylindrical wall 214 of the cryogenic vessel 200, and the set of outer coils 144 is mounted at an outer cylindrical wall 216 of the cryogenic vessel 200.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 10 superconductive magnet (state of the art)
12 cryogenic vessel (state of the art)
14, 16 main magnet coils (state of the art)
22 inner layer, 4K vessel (state of the art)
24 radiation shield (state of the art)
26 outer layer, 300K vessel (state of the art)
28 inner wall (state of the art)
30 outer wall (state of the art)
32 mounting structure
110 magnetic resonance (MR) examination system
112 magnetic resonance (MR) scanner
114 main magnet, superconductive magnet
116 RF examination space
118 center axis
120 subject of interest
122 magnetic gradient coil system
124 RF screen
126 MR imaging system control unit
128 monitor unit
130 MR image reconstruction unit
132 control line
134 RF transmitter unit
136 RF switching unit
138 control line
140 radio frequency (RF) antenna device
142 set of inner coils
144 set of outer coils
158 inner conductive loop
160 outer conductive loop
200 cryogenic vessel
202 inner mounting structure, inner vessel, 4K vessel
204 outer 300K vessel
206 radiation shield
208 inner shield layer
210 outer shield layer
212 welding spot
214 inner cylindrical wall
216 outer cylindrical wall
218 flange
220 mounting frame

The invention claimed is:

1. A cryogenic vessel for use in a magnetic resonance examination system to mount superconductive main coils, the cryogenic vessel comprising:
   an outer vessel,
   a radiation shield located inside the outer vessel, and
   an inner mounting structure for mounting the superconductive main coils, which is located within the radiation shield,
   whereby the radiation shield has at least one dry-friction area, where dry-friction is generated upon deformation of the radiation shield;
   wherein the at least one dry-friction area comprises at least two shield layers, which are stacked on each other in surface contact, whereby the at least two shield layers are locally connected to each other; and
   wherein one of the at least two shield layers comprising the dry-friction area is copper.

2. The cryogenic vessel according to claim 1, whereby the at least two shield layers are locally connected to each other by spot welding.

3. The cryogenic vessel according to claim 1, whereby the at least two shield layers are locally connected to each other by rolling.

4. The cryogenic vessel according to claim 1, whereby at least one shield layer of the radiation shield is made of aluminum.

5. The cryogenic vessel according to claim 1, whereby at least two shield layers of the radiation shield are made of different materials.

6. The cryogenic vessel according to claim 1, whereby at least two shield layers of the radiation shield have a different thickness.

7. The cryogenic vessel according to claim 1, wherein the radiation shield has at least one cylindrical wall and has a uniform thickness in the at least one cylindrical wall of the cryogenic vessel.

8. The cryogenic vessel according to claim 1, whereby the at least one dry-friction area comprises a local patch, which is attached to the radiation shield.

9. The cryogenic vessel according to claim 1, wherein the radiation shield has a cylindrical wall with longitudinal ends and the at least one dry-friction area is provided at one of the longitudinal ends of the cylindrical wall of the cryogenic vessel.

10. The cryogenic vessel according to claim 1, whereby at least one dry-friction area is provided at one flange of the cryogenic vessel.

11. The cryogenic vessel according to claim 1, whereby the inner mounting structure is provided as an inner vessel for mounting the superconductive main coils therein, whereby the inner vessel is adapted for containing a cryogen.

12. The cryogenic vessel of claim 1, further including an inner vessel that is surrounded by the radiation shield.

13. The cryogenic vessel of claim 12, wherein the inner mounting structure is mounted at an inner side of the inner vessel.

14. The cryogenic vessel according to claim 1, wherein the at least one dry-friction area is provided locally in an area where local vibrations occur during operation of the magnetic resonance examination system.

15. The cryogenic vessel according to claim 1, wherein the radiation shield is cooled by a cryo-cooling system comprising a cold head.

16. A superconductive magnet for a magnet resonance examination system, the super conductive magnet comprising:
a cryogenic vessel; and
a set of superconductive main coils which are arranged in the cryogenic vessel;
wherein the cryogenic vessel includes:
an outer vessel;
a radiation shield located inside the outer vessel and cooled by a cryo-cooling system comprising a cold head; and
an inner mounting structure on which are mounted the superconductive main coils, the inner mounting structure being located within an inner vessel inside the radiation shield, wherein the radiation shield has at least one dry-friction area, where dry-friction is generated upon deformation of the radiation shield;
wherein the inner mounting structure is mounted to an inner cylindrical wall of the inner vessel and extends towards an outer cylindrical wall of the inner vessel.

17. A magnetic resonance examination system comprising:
a superconductive magnet according to claim 16; and
at least one magnetic field gradient coil.

18. The cryogenic vessel of claim 16, wherein the at least one dry-friction area is provided locally at the location of the superconductive main coils.

19. The cryogenic vessel of claim 16, wherein the at least one dry-friction area comprises at least two shield layers, which are stacked on each other in surface contact, whereby the at least two shield layers are locally connected to each other.

* * * * *